May 18, 1965 SEENING YEE 3,184,609

TRANSISTOR GATED SWITCHING CIRCUIT HAVING HIGH INPUT IMPEDANCE AND LOW ATTENUATION

Filed Aug. 27, 1962

INVENTOR.
SEENING YEE
BY
John H. Gallagher
ATTORNEY 3,184,609

TRANSISTOR GATED SWITCHING CIRCUIT HAVING HIGH INPUT IMPEDANCE AND LOW ATTENUATION

Seening Yee, Whitestone, N.Y., assignor to Sperry Rand Corporation, Great Neck, N.Y., a corporation of Delaware Filed Aug. 27, 1962, Ser. No. 219,577
6 Claims. (Cl. 307—88.5)

This invention relates to a transistor switching circuit that exhibits a high input impedance and a very low attenuation.

The switch of this invention is a gated series sampling switch comprised of a three terminal transistor connected in a common base arrangement. This general type of switch is known in the art and is particularly useful where high switching speeds are required. As constructed and operated in the past, the known series sampling switch is characterized by having a relatively low input impedance, this being the property of the transistor. In some applications of a sampling switch it is undesirable for the switch to have a low input impedance because it will cause a disturbing effect on the source being sampled and on the signal coupled therefrom. In analog computers, as one example, information sometimes is stored in capacitors and these capacitors are periodically sampled by means of a sampling switch. A low impedance switch will have the effect of allowing a significant portion of the stored charge in the capacitor to leak off and thus could introduce error and unreliable operation of the computer.

It therefore is an object of this invention to provide a transistor series switching circuit having a high input impedance.

It is another object of this invention to provide a high input impedance transistor switch having a low voltage drop thereacross.

A further object of this invention is to provide a simple series sampling gate that is capable of accurately and reliably sampling a voltage source at high speed without appreciably disturbing said source.

It is a further object of this invention to provide a sampling gate wherein the source of voltage to be sampled is substantially completely isolated from the load in the absence of a sampling signal.

Figure 1:
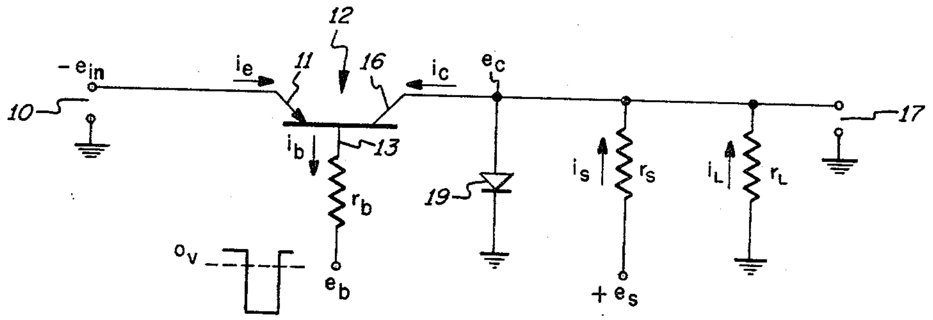
Figure 2:
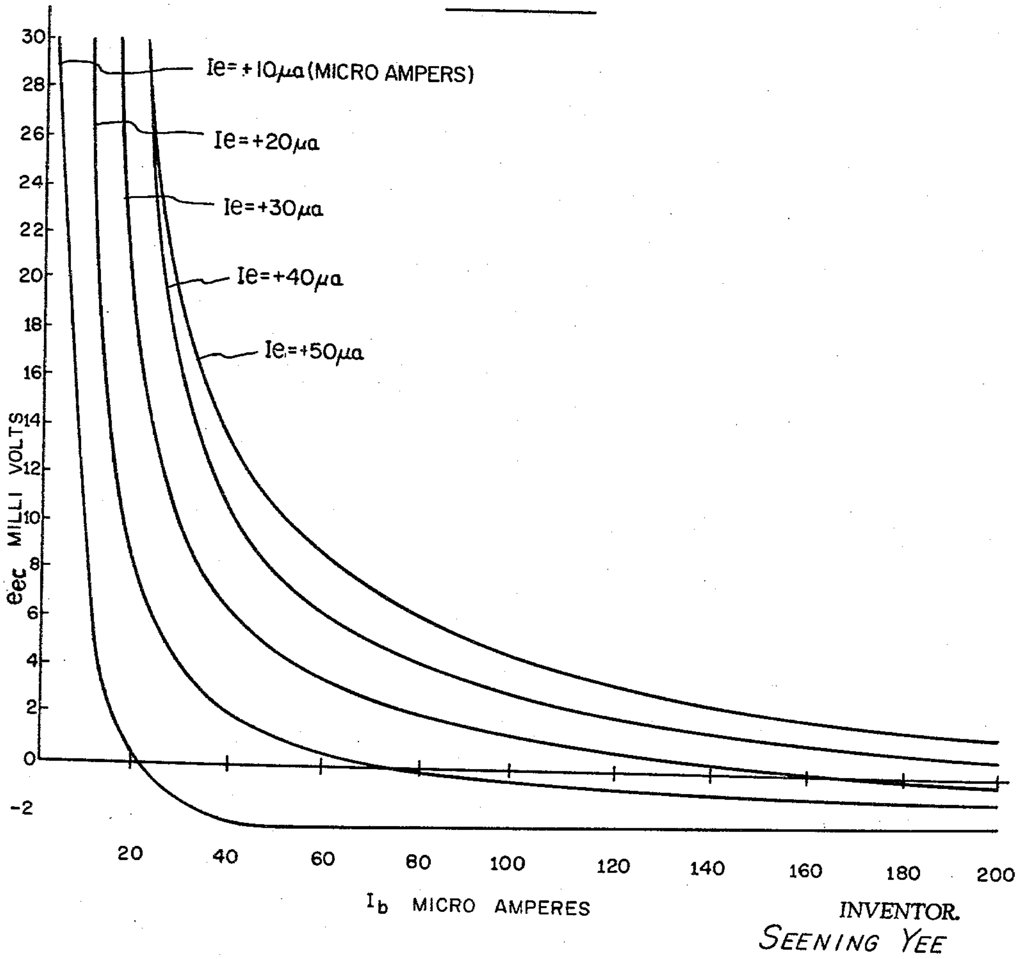

The invention will be discussed in connection with the accompanying drawings wherein:

FIG. 1 is a schematic diagram of the transistor switch circuit of this invention, and FIG. 2 is a series of curves illustrating the characteristics of a transistor operated in accordance with this invention.

In accordance with the present invention the switch is comprised of a three-terminal transistor having, in the preferred embodiment, the emitter coupled to the input source of negative voltage signals that are to be sampled, the collector coupled to the load, and the base coupled to a source that supplies sampling pulses that cause the normally non-conducting transistor to conduct. A very high impedance current source (constant current source) is coupled to the collector, and a diode is coupled between the collector and ground and is poled for forward conduction to ground. Circuit parameters are chosen so that the constant current source supplies current to the base in sufficient quantity to keep to a minimum the emitter current drawn during conduction of the transistor. This has the effect of making the input impedance of the switch appear to be very much higher than it would be in the absence of the constant current source. During conduction of the transistor the diode is back-biased by the negative signal passed by the transistor, thus causing current from the constant current source to flow to the base of the transistor. When the transistor is cut-off, the diode is forward biased and conducts current from the constant current source to ground.

Referring now in more detail to the preferred embodiment of the invention illustrated in FIG. 1, the switching circuit is comprised of an input terminal 10 supplied by a source of negative potential $-e_{in}$. Input terminal 10 is coupled to the emitter 11 of a p-n-p transistor 12. The base 13 of transistor 12 is coupled through resistor $r_d$ to a source of sampling pulses $e_b$ that supplies negative pulses that are sufficiently negative to render transistor 12 conductive during their occurrences. Collector 16 is connected to a load represented by resistor $r_L$ which also is connected to ground. The output signal developed across load $r_L$ is taken from output terminal 17. A source of positive potential $e_s$ is coupled through resistor $r_s$ to collector 16, and together, source $e_s$ and resistor $r_s$ comprises a high impedance source. Theoretically, an infinite impedance constant current source is desired for this source $e_s$. Diode 19 also is connected to collector 16 and is poled for forward construction from constant current source $e_s$ to ground.

Transistor 12 normally is held in the non-conducting state by a positive potential applied to the base 13 by the sampling source $e_b$. The magnitude of the negative sampling pulses from sampling source $e_b$ are sufficient to cause transistor 12 to conduct at the most negative potential anticipated to be applied to emitter 11 by the input signal $-e_{in}$. It may be seen from FIG. 1 that when transistor 12 is rendered conductive to saturation by the application of a negative sampling pulse from sampling source $e_b$ to base 13, both the emitter-base junction and the collector-base junction of transistor 12 are forward biased. The distinguishing feature of this saturated transistor operation is that both the emitter and collector currents are flowing into the transistor instead of the collector current flowing "in" and the emitter current flowing "out" of the transistor, as in the conventional mode of operation. The emitter-to-collector potential drop is less in the circuit of this invention than in the known switching circuits and therefore results in greater accuracy when used in an analog computer.

The input impedance $Z_{in}$ of the switch as seen at input terminal 10 is expressed as $$Z_{in}=\frac{e_{in}}{i_e}$$

It may be seen that in order to obtain a high input impedance it is necessary that the emitter current $i_e$ be as small as possible and not vary appreciably for different values of input signals $-e_{in}$. In the circuit illustrated in FIG. 1, the base current $i_b$ is equal to the sum of the emitter current $i_e$ and the collector current $i_c$. It therefore may be seen that the emitter current $i_e$ may be minimized by causing the collector current $i_c$ to supply substantially all the current customarily supplied to the base during conduction of transistor 12. In accordance with this invention this is accomplished by providing the constant current source comprised of the combination of potential source $+e_s$ and resistor $r_s$. With this constant current source present the circuit parameters are proportioned so that at the desired operating conditions of the switch the sum of the load current $i_L$ drawn by load resistor $r_L$ and the current $i_s$ drawn through resistor $r_s$, i.e. collector current $i_c$, is substantially equal to the base current $i_b$. With this condition existing, the emitter current $i_e$ is equal to zero and the input impedance $Z_{in}$ theoretically is infinite for a particular value of input voltage $-e_{in}$. The parameters of the constant current source are so proportioned with respect to the other components and characteristics of the circuit so that the constant current $i_s$ constitutes a major portion of the collector current $i_c$, and because of the high impedance of this constant current source the variation in magnitude of this current as a function of the variation in the magnitude of the input signal $-e_{in}$ is a minimum. Therefore, the change in the input impedance $Z_{in}$ with a change in the magnitude of the input signal $-e_{in}$ also is minimized.

It will be understood by those skilled in the art that the terms "constant current" and "constant current source" are words of art that are more relative than exact and indicate that the source supplying the current has a high impedance and the current drawn from the source does not appreciably change with a change in the value of the load. These being well known terms in the art, applicant intends that they be so understood in this description and the following claims, and that no different or more restrictive definition be applied.

When transistor 12 is cut off due to the application of a positive potential to base 13 from switching source $e_b$, the constant current $i_s$ is coupled directly through diode 19 to ground and is not coupled through the collector-base junction of transistor 12. During conduction of transistor 12, the collector potential $e_c$ is substantially at the negative potential of the input source $-e_{in}$ so that diode 19 is back-biased and therefore is substantially out of the circuit. Although the use of diode 19 presently is preferred, it could be replaced by a switching transistor operating "on" and "off" in the same way as that required of the diode described above.

In addition to the high impedance achieved with the circuit constructed and operated in accordance with this invention, the circuit also provides an extremely low voltage drop across the transistor during conduction thereof. That is, the emitter-collector voltage drop $e_{ec}$ is extremely low for a given value of emitter current, as is indicated by the curves of FIG. 2 which shows that the curves for the different values of emitter current are rather closely grouped about the zero axis rather than being in a group that lies somewhat above the zero axis as would be the case if the transistor were operated in the inverted mode of operation. This characteristic is obtainable only when both the emitter and collector currents are flowing into the transistor instead of the collector current "in" and the emitter current "out," as in conventional operation in the inverted mode.

A further advantageous feature of the invention may be seen in FIG. 1, this being the fact that when the switch is open, that is, transistor 12 is non-conducting, the source being sampled $-e_{in}$ is substantially completely isolated from the load represented by resistor $r_L$. In practice, load resistor $r_L$ may be the input circuit of a transistor or vacuum tube amplifier, for example.

In one circuit that was constructed and operated successfully in accordance with the principles of this invention, the circuit parameters had the following approximate values:

| | |
|---|---|
| Base resistor $r_b$ | 215 kilo-ohms. |
| Load resistor $r_L$ | 1 mega-ohms. |
| Constant current source resistor $r_s$ | 324 kilo-ohms. |
| Potential of source $e_s$ | +20 volts. |
| Input source $-e_{in}$ | 0 to −6 volts. |
| Switching potential $e_b$ | −20 volts. |
| Diode 19 | 1N914. |
| Transistor 12 | 2N1920. |

The above-described switching circuit operated successfully at a speed in excess of 100 kilocycles per second, and with a voltage drop $e_{ec}$ across the switch of less than 2 millivolts.

The operation of the circuit of FIG. 1 is not limited to an input signal $e_{in}$ comprised of a negative level, as described above. The input signal may be comprised of a continuously varying signal that "rides" on a negative D.C. potential. If the switching signal $e_b$ is a continuous negative signal that maintains the transistor in a continuous conducting state, then diode 19 may be omitted from the circuit since it would be back-biased at all times, and thus effectively out of the circuit.

The circuit of this invention also may be constructed with a n-p-n transistor merely by reversing the polarities of the voltage sources, and diode 19, if used.

Further, the emitter and collector electrodes may be interchanged, although this arrangement presently is not preferred because its emitter-collector potential drop is greater than that of the embodiment illustrated in FIG. 1.

While the invention has been described in its preferred embodiments it is to be understood that the words which have been used are words of description rather than of limitation and that changes within the purview of the appended claims may be made without departing from the true scope and spirit of the invention in its broader aspects.

What is claimed is:

1. A series switching circuit comprising in combination,
   a three-terminal transistor having an emitter, a base, and a collector,
   a source of switching control signals coupled to said base for controlling the conduction of said transistor,
   a source of signals to be sampled coupled to one of the other of said terminals of the transistor and being of a polarity to forward bias the conduction path between said one terminal and base,
   a load coupled to the remaining terminal of said transistor,
   a source of substantially constant current coupled to said remaining terminal and being a polarity to forward bias the conduction path between said remaining terminal and base,
   the polarities and magnitudes of the potentials of said sources being chosen to cause the collector current to be substantially equal to the base current when said transistor is conducting,
   and a unidirectional current conducting device coupled between said remaining terminal and ground and poled for conduction only when said transistor is nonconducting.

2. A gated switching circuit comprising
   a transistor having a base and only two other terminals separated from said base by respective rectifying junctions,
   a source of signals to be sampled coupled to one of said other terminals and a load coupled to the remaining one of said other terminals,
   a source of gating pulses coupled by impedance means to said base to render said transistor conducting and thereby couple said load to said source of signals to be sampled during the occurrence of each gating pulse,
   a high impedance substantially constant current source coupled in parallel with said load,
   said source of signals to be sampled and said substantially constant current source each providing respective signals to forward bias the emitter-base junction and the collector-base junction of the transistor,
   the potentials of said sources and the circuit parameters associated with said transistor being proportioned to cause the substantially constant current from said high impedance source and the current through said load to furnish substantially all the current flowing through said base when said transistor is rendered conductive by said gating pulses.

3. The combination claimed in claim 2 wherein said signals to be sampled are at a negative potential with respect to the potential of said constant current source, and further including in the combination, a unidirectional current conduction device connected in parallel with said constant current source and poled for forward current conduction to ground from said constant current source when said transistor is non-conducting.

4. A gated switching circuit comprising in combination, a three-terminal transistor having an emitter, a base, and a collector, a source of negative signals to be sampled coupled to said emitter, a resistor connecting said base to a switching source that supplies negative pulses to said base to render said transistor conductive for the duration of said negative pulses, a load coupled to said collector, a high impedance source of current at a positive potential with respect to the potential of said negative pulses coupled to said collector in parallel with said load, the impedance and potential of said current source being proportioned to supply a major portion of the current drawn by said base when said negative pulses are applied thereto, and being proportioned with respect to the impedance of said load so that together said constant current from the high impedance source and the current through the load comprise substantially all the current drawn by said base, whereby the current flowing through the emitter is a minimum and the input impedance of said switching circuit is extremely high.

5. A series switching circuit comprising in combination, a three-terminal transistor having an emitter, a base, and a collector, a source of signals to be sampled coupled to said emitter, said signals to be sampled being of a polarity to forward bias the emitter-base conduction path of said transistor, a source of switching signals coupled to said base to control the conduction of the transistor, resistive means connected between said source of switching signals and said base, a load coupled to said collector, a constant current source coupled to said collector in parallel with said load and being of a polarity to forward bias the collector-base conduction path of said transistor, and a unidirectional current conduction device connected between said collector and ground and poled for conduction between ground and said constant current source when said transistor is non-conducting.

6. A series switching circuit comprising in combination, a three-terminal transistor having an emitter, a base, and a collector, a source of negative potential signals to be sampled coupled to said emitter, a source of negative potential switching signals coupled to said base to control the conduction of the transistor, resistive means connected between said source of switching signals and said base, a load coupled to said collector, a constant current source at a positive potential coupled to said base in parallel with said load, whereby current flows in the forward directions from said emitter to base and collector to base during conduction of said transistor, and a unidirectional current conduction device connected between said collector and ground and poled for forward conduction from said constant current source to ground when said transistor is nonconducting.

References Cited by the Examiner

UNITED STATES PATENTS

| | | | |
|---|---|---|---|
| 2,718,613 | 9/55 | Harris | 307—88.5 |
| 3,078,378 | 2/63 | Burley et al. | 307—88.5 |

ARTHUR GAUSS, *Primary Examiner*.